(12) United States Patent
Sharma et al.

(10) Patent No.: US 7,391,641 B2
(45) Date of Patent: *Jun. 24, 2008

(54) MULTI-LAYERED MAGNETIC MEMORY STRUCTURES

(75) Inventors: Manish Sharma, Sunnyvale, CA (US); Lung Tran, Saratoga, CA (US); Thomas C. Anthony, Sunnyvale, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 125 days.

This patent is subject to a terminal disclaimer.

(21) Appl. No.: 11/285,991

(22) Filed: Nov. 23, 2005

(65) Prior Publication Data

US 2007/0115718 A1   May 24, 2007

(51) Int. Cl.
 *G11C 11/00* (2006.01)
(52) U.S. Cl. .................................. 365/158; 365/173
(58) Field of Classification Search ............. 365/158, 365/173
See application file for complete search history.

(56) References Cited

U.S. PATENT DOCUMENTS

| | | | |
|---|---|---|---|
| 6,576,969 B2 | 6/2003 | Tran et al. | |
| 6,750,491 B2 * | 6/2004 | Sharma et al. | 257/295 |
| 6,803,274 B2 | 10/2004 | Sharma et al. | |
| 6,891,212 B2 | 5/2005 | Sharma et al. | |
| 6,891,746 B2 | 5/2005 | Tran et al. | |
| 6,903,403 B2 | 6/2005 | Sharma et al. | |
| 6,924,539 B2 | 8/2005 | Sharma et al. | |
| 6,936,903 B2 | 8/2005 | Anthony et al. | |
| 6,956,271 B2 | 10/2005 | Sharma | |
| 6,980,466 B2 | 12/2005 | Perner et al. | |
| 6,989,975 B2 | 1/2006 | Nickel et al. | |
| 7,027,320 B2 | 4/2006 | Sharma | |
| 7,167,391 B2 | 1/2007 | Sharma et al. | |
| 7,195,927 B2 * | 3/2007 | Sharma et al. | 438/3 |
| 2004/0184311 A1 | 9/2004 | Sharma | |
| 2006/0023494 A1 | 2/2006 | Jeong et al. | |
| 2006/0028862 A1 | 2/2006 | Min et al. | |
| 2006/0083054 A1 | 4/2006 | Jeong | |
| 2006/0087880 A1 | 4/2006 | Mancoff et al. | |
| 2006/0239064 A1 | 10/2006 | Liaw | |
| 2007/0097730 A1 | 5/2007 | Chen et al. | |
| 2007/0115718 A1 | 5/2007 | Sharma et al. | |

OTHER PUBLICATIONS

U.S. Appl. No. 11/286,009, filed Nov. 23, 2005, Sharma et al.
U.S. Appl. No. 11/286,245, filed Nov. 23, 2005, Sharma et al.

* cited by examiner

*Primary Examiner*—Michael T Tran
(74) *Attorney, Agent, or Firm*—Myers Bigel Sibley & Sajovec, P.A.

(57) ABSTRACT

An exemplary memory array including a plurality of memory cells, each of the memory cells comprises a first ferromagnetic layer, a second ferromagnetic layer spaced apart from the first ferromagnetic layer by a non-magnetic separating layer and being magnetically coupled to the first ferromagnetic layer by demagnetizing fields from the first ferromagnetic layer, a spacer layer above the second ferromagnetic layer, and a reference layer above the spacer layer. The first ferromagnetic layer, non-magnetic separating layer, and second ferromagnetic layer in combination function as a data layer of the memory cell.

26 Claims, 15 Drawing Sheets

M1 = moment of first ferromagnetic layer
m2 = moment of second ferromagnetic layer M1 = moment of first ferromagnetic layer
m2 = moment of second ferromagnetic layer

MULTI-LAYERED MAGNETIC MEMORY STRUCTURES

BACKGROUND

A memory chip generally comprises a plurality of memory cells that are deposited onto a silicon wafer and addressable via an array of column conducting leads (bit lines) and row conducting leads (word lines). Typically, a memory cell is situated at the intersection of a bit line and a word line. The memory cells are controlled by specialized circuits that perform functions such as identifying rows and columns from which data are read or to which data are written. Typically, each memory cell stores data in the form of a "1" or a "0," representing a bit of data.

An array of magnetic memory cells can be referred to as a magnetic random access memory or MRAM. MRAM is generally nonvolatile memory (i.e., a solid state chip that retains data when power is turned off). At least one type of magnetic memory cell includes a data layer and a reference layer, separated from each other by at least one intermediate layer. The data layer may also be referred to as a bit layer, a storage layer, or a sense layer. The reference layer may also be referred to as a pinned layer. In a magnetic memory cell, a bit of data (e.g., a "1" or "0") may be stored by "writing" into the data layer via one or more conducting leads (e.g., a bit line and a word line). The write operation is typically accomplished via a write current that sets the orientation of the magnetic moment in the data layer to a predetermined direction.

Once written, the stored bit of data may be read by providing a read current through one or more conducting leads (e.g., a read line) to the magnetic memory cell. For each memory cell, the orientations of the magnetic moments of the data layer and the reference layer are either parallel (in the same direction) or anti-parallel (in different directions) to each other. The degree of parallelism affects the resistance of the cell, and this resistance can be determined by sensing (e.g., via a sense amplifier) an output current or voltage produced by the memory cell in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification. The sensed current is inversely proportional to the resistance of the magnetic memory cell. Thus, $I_s=V/R$ (when magnetic moments are parallel) or $I_s=V/(R+\Delta R)$ (when magnetic moments are anti-parallel), where V is the applied voltage, $I_s$ is the sensed current, R is the nominal resistance of the magnetic memory cell, and $\Delta R$ is the change in resistance.

The intermediate layer, which may also be referred to as a spacer layer, may comprise insulating material (e.g., dielectric), non-magnetic conducting material, and/or other known materials, and is usually thick enough to prevent exchange coupling between the data and reference layers. The various conducting leads which are used to address the memory cells (e.g., bit lines, word lines, and read lines), and to provide currents to pass through the data and reference layers to read data from or write data to the memory cells are provided by one or more additional layers, called conducting layer(s).

Throughout this application, various exemplary embodiments will be described in reference to the TMR memory cells as first described above. Those skilled in the art will readily appreciate that the exemplary embodiments may also be implemented with other types of magnetic memory cells (e.g., other types of TMR memory cells, GMR memory cells, AMR memory cells, CMR memory cells, etc.) according to the requirements of a particular implementation.

Generally speaking, desirable characteristics for any configuration of memory device include increased speed, reduced power consumption, and/or lower cost. A simpler fabrication process and/or a smaller chip size may achieve lower cost. However, as magnetic memory cells become smaller, typically, higher operating current is required for achieving "write" operations. FIG. 1 illustrates some exemplary relationships between various aspect ratios (at a fixed thickness) of a ferromagnetic layer and their coercivities. As shown in FIG. 1, magnetic coercivity increases as memory cell area decreases. As a result, an increased write current is generally needed to reverse the magnetic orientations of one or more layers of the memory cell. Higher operating current is undesirable because it goes hand-in-hand with higher power requirements, increased concern about electromigration, increased write circuitry area, and increased cost. One way to reduce the coercivity in a small magnetic memory cell is to reduce the thicknesses of the ferromagnetic layers. However, as the total magnetic volume decreases, the magnetic memory cell also becomes less thermally stable. FIG. 2 illustrates some exemplary relationships between temperature and the coercivities of ferromagnetic layers at various thicknesses (at a fixed lateral area).

Thus, a market exists for a multi-layered magnetic memory structure that has improved thermal stability as well as reduced coercivity.

SUMMARY

An exemplary memory array including a plurality of memory cells, each of the memory cells comprises a first ferromagnetic layer, a second ferromagnetic layer spaced apart from the first ferromagnetic layer by a non-magnetic separating layer and being magnetically coupled to the first ferromagnetic layer by demagnetizing fields from the first ferromagnetic layer, a spacer layer above the second ferromagnetic layer, and a reference layer above the spacer layer. In an exemplary implementation, the first ferromagnetic layer, the non-magnetic separating layer, and the second ferromagnetic layer in combination function as a data layer of the memory cell.

An exemplary method for writing data into the multi-layered magnetic memory structure comprises providing a first magnetic field to reverse a magnetic moment of the first ferromagnetic layer and providing a second magnetic field less than the first magnetic field to reverse a magnetic moment of the second ferromagnetic layer without reversing the magnetic moment of the first ferromagnetic layer.

An exemplary method for reading the multi-layered magnetic memory structure comprises connecting a sensing device to the magnetic memory structure to measure the resistance between a reference layer and the second ferromagnetic layer, providing a first magnetic field in a first direction exceeding the coercivity of the second ferromagnetic layer but not exceeding the coercivity of the first ferromagnetic layer, removing the first magnetic field, sensing (via the sensing device) any change in resistance between the second ferromagnetic layer and the reference layer, and determining a magnetic moment of the first ferromagnetic layer based on the sensing.

Other embodiments and implementations are also described below.

DETAILED DESCRIPTION

I. Overview

Exemplary multi-layered magnetic memory structures and exemplary read and write operations for operating the structures are described herein.

Section II describes an exemplary multi-layered magnetic memory structure.

Section III describes exemplary read operations.

Section IV describes exemplary write operations.

Section V describes an exemplary process for making the exemplary multi-layered magnetic memory structure.

II. An Exemplary Multi-Layered Magnetic Memory Structure Configuration

Figure 1:
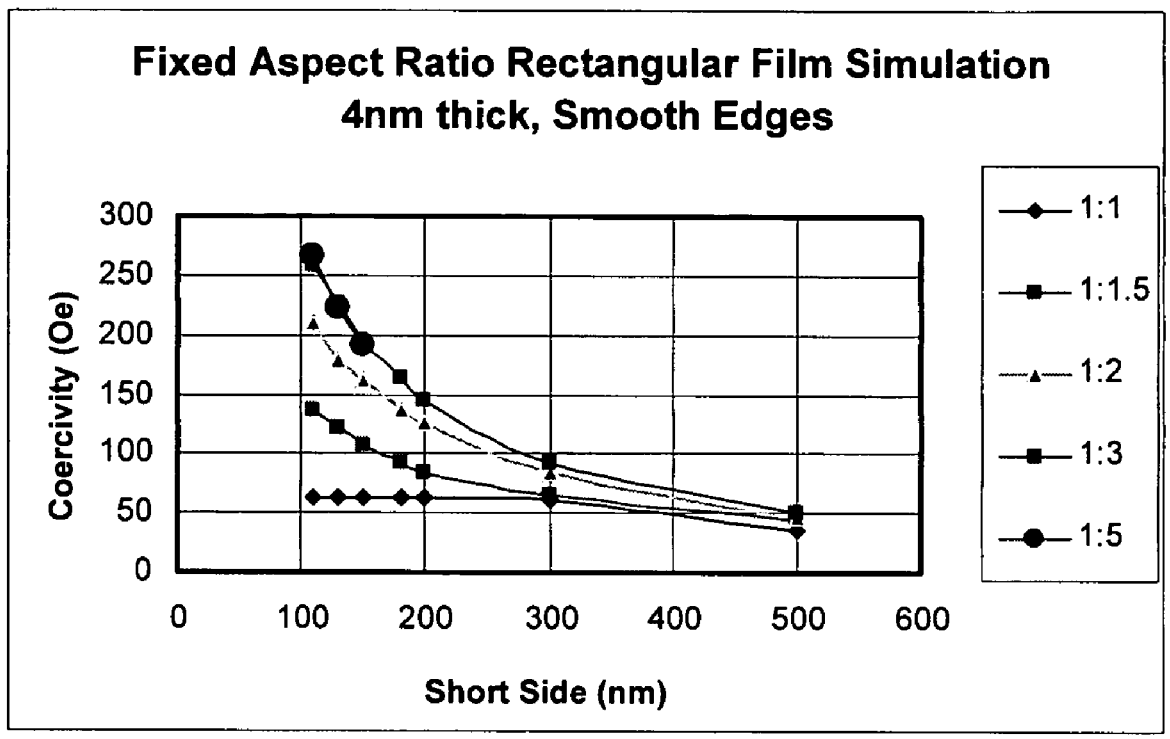
FIG. 1 illustrates an exemplary representation of some relationships between lateral dimensions of a ferromagnetic layer and changes in its coercivities.
Figure 2:
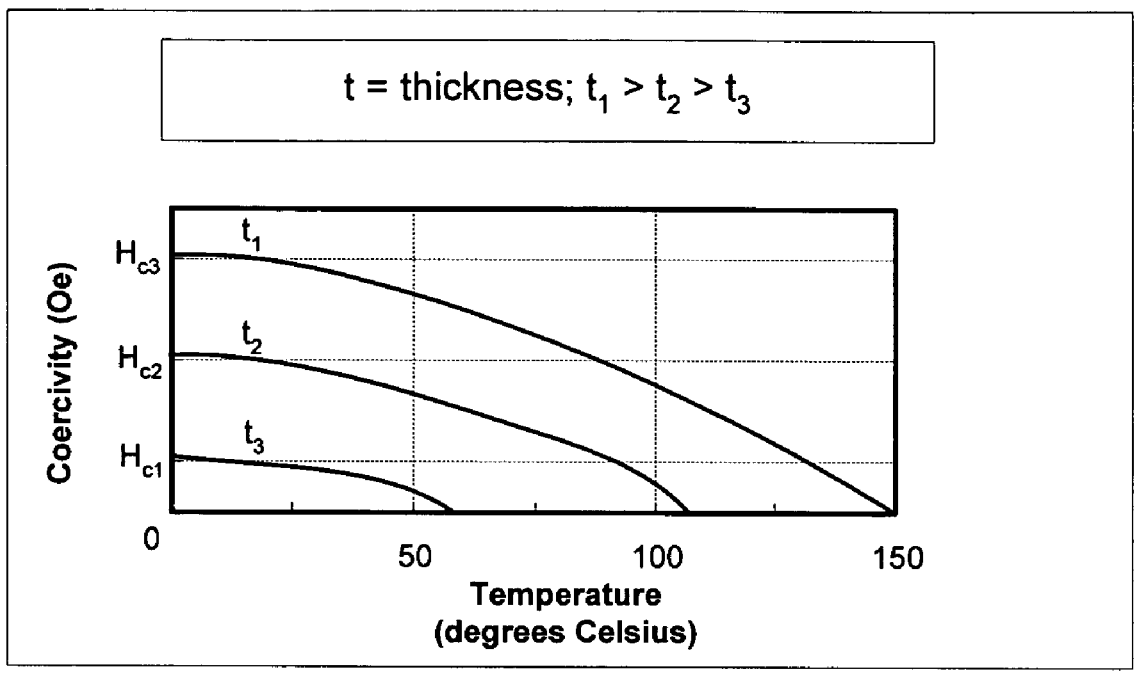
FIG. 2 illustrates exemplary representation of some relationships between the temperatures applied to a ferromagnetic layer having different thicknesses and changes in its coercivities.
Figure 3:
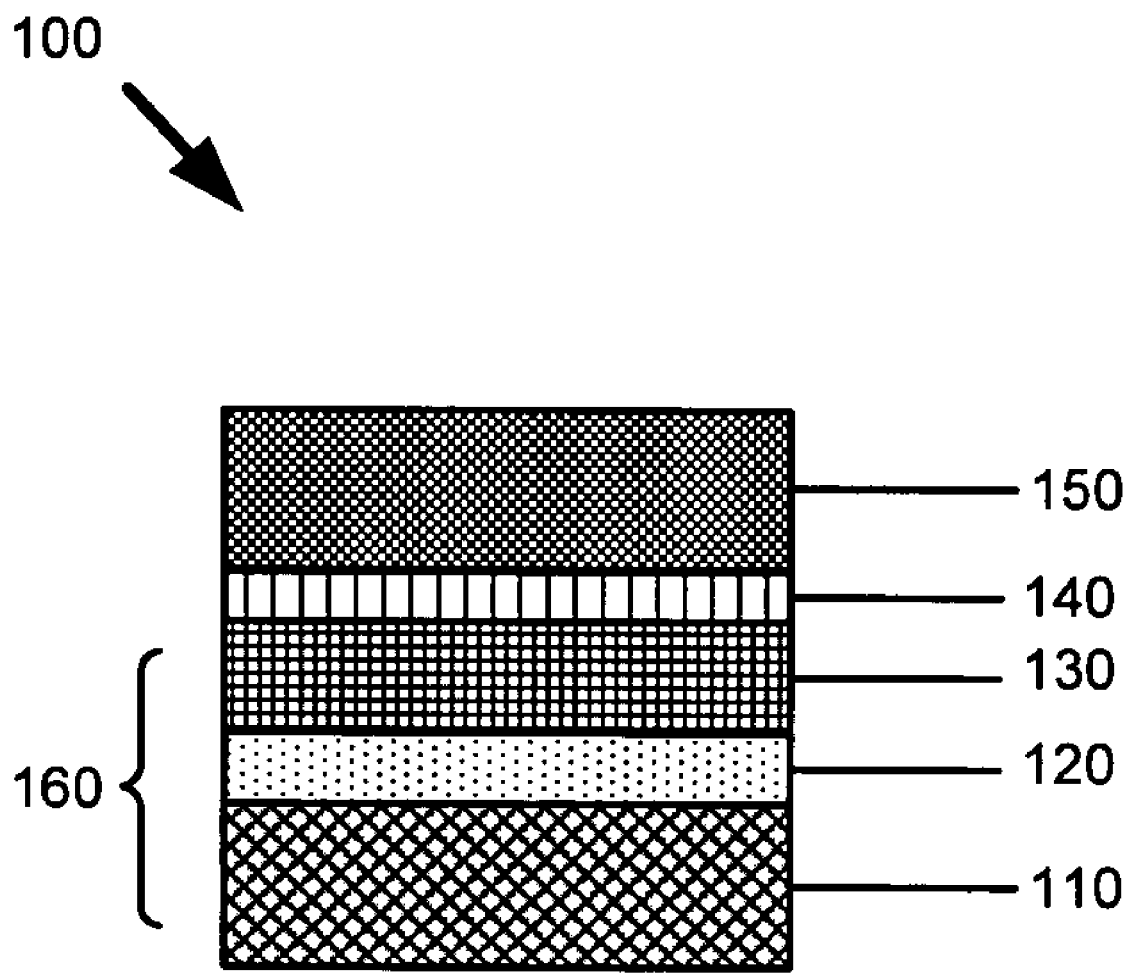
FIG. 3 illustrates an exemplary multi-layered magnetic memory structure.

Generally, a memory structure may be made as top-pinned (where the reference layer is on top of the data layer) or bottom-pinned (where the reference layer is below the data layer). For ease of explanation, only the top-pinned configuration is shown in FIG. 3 and referenced in the description of various exemplary embodiments herein. However, this configuration is merely illustrative. Thus, one skilled in the art will readily appreciate that other configurations (e.g., bottom-pinned, etc.) may also be implemented in accordance with any particular design requirement.

In FIG. 3, the top-pinned memory structure 100 includes a first ferromagnetic layer 110, a non-magnetic separating layer 120, a second ferromagnetic layer 130, a spacer layer 140, and a reference layer 150. For ease of explanation, the combination of the first ferromagnetic layer 110, the non-magnetic separating layer 120, and the second ferromagnetic layer 130 may be referred to as a data layer 160, and the layers 110-150 may be referred to as a memory cell 100. Of course, the memory cell 100 may also be bottom-pinned (not shown), in which case the reference layer 150 is below the data layer 160. For clarity of illustration, additional structures and/or layers known in the art are not illustrated in FIG. 3. For example, multiple conductors (not shown) near the memory cell 100 can be used collectively for write and read operations. An exemplary memory array including nearby conductors will be described in more detail below with reference to FIG. 5.

Another magnetic memory structure configuration may also include a seed layer, a protective cap layer, an anti-ferromagnetic layer and/or other layers. The seed layer generally enhances crystalline alignment. Exemplary materials for a seed layer include Ta, Ru, NiFe, Cu, or combinations of these materials. The protective cap layer protects the data layer 160 from the environment (e.g., by reducing oxidation of the data layer 160) and may be formed using any suitable material known in the art, for example, Ta, TaN, Cr, Al or Ti. The anti-ferromagnetic layer enhances magnetic stability in the reference layer 150. Exemplary materials for an anti-ferromagnetic layer include IrMn, FeMn, NiMn, PtMn, and/or other well known materials. For ease of explanation, these additional layers are not shown in the Figures; however, magnetic memory structures having one or more of these (or other) additional layers may be implemented with various embodiments to be described herein in accordance with design choices.

The first and second ferromagnetic layers (110 & 130) may comprise one or more ferromagnetic materials. In an exemplary embodiment, ferromagnetic materials suitable for these layers include, without limitation, NiFe, NiFeCo, CoFe, other magnetic alloys of NiFe and Co, amorphous ferromagnetic alloys, and other materials.

In an exemplary implementation, the first ferromagnetic layer 110 has a higher magnetic coercivity than the second ferromagnetic layer 130. As a result, a higher magnetic field (in either the positive or negative direction) is required to switch the magnetic moment (or orientation) of the first ferromagnetic layer 110 than the amount required to switch the magnetic moment of the second ferromagnetic layer 130. A higher coercivity in a layer of ferromagnetic material can be achieved by adjusting the lateral aspect ratio, thickness, material, deposition conditions, and/or other parameters of the layer in accordance with design choice. In an exemplary implementation described herein, the first ferromagnetic layer 110 is thicker than the second ferromagnetic layer 130 but has substantially the same lateral size and material as the second ferromagnetic layer 130. In this implementation, data can be stored in the first ferromagnetic layer 110 (having a relatively higher coercivity than the second ferromagnetic layer 130) by switching the magnetic moment of the first ferromagnetic layer 110 to a desired position during a write operation. An exemplary write operation will be described in more detail below with reference to FIGS. 8-10.

The non-magnetic separating layer 120 may comprise electrically conducting, semi-conducting, or insulating materials, depending on design choice. Exemplary conducting materials include Cu, Au, Ag, and/or other non-magnetic conducting materials. Exemplary semi-conducting materials include polysilicon, amorphous silicon, and/or other non-magnetic semi-conducting materials. Exemplary insulating materials include $SiO_2$, $SiN_x$, MgO, $Al_2O_3$, $AlN_x$, $TaO_x$, and/or other insulating materials.

In an exemplary implementation, the thickness of the non-magnetic separating layer 120 is determined based on a desired demagnetizing coupling effect between the first ferromagnetic layer 110 and the second ferromagnetic layer 130. In general, as the non-magnetic separating layer 120 becomes thinner, a stronger demagnetizing coupling between the two ferromagnetic layers (110 & 130) results. As the edges of the ferromagnetic layers (110 & 130) get closer to each other, the effects of the demagnetizing fields emanating from the edges become stronger. The demagnetizing fields emanating from each ferromagnetic layer can improve or undermine the stability of the magnetic orientations of nearby ferromagnetic layers. For example, if the magnetic moments of two nearby ferromagnetic layers are antiparallel, then the demagnetizing fields from each of the two layers can improve the stability of the magnetic orientation of the other layer. However, if the magnetic moments of two nearby ferromagnetic layers are parallel, then the demagnetizing fields from each of the two layers can undermine the stability of the other layer, or even cause switching of the magnetic orientation of one of the two layers.

In an exemplary implementation, the magnetic moment of the second ferromagnetic layer 130 is set to be in an antiparallel position relative to the magnetic moment of the first ferromagnetic layer 110 after each write operation so that the demagnetizing fields from the second ferromagnetic layer 130 can in fact improve the stability of the data written into the first ferromagnetic layer 110 (rather than corrupting the data). However, if the demagnetizing fields from the second ferromagnetic layer 130 become too strong (e.g., by being too close to the first ferromagnetic layer 110), they may cause the magnetic moment of the first ferromagnetic layer 110 to become so stable that a higher write current may be required to write into the first ferromagnetic layer 110. Depending on these and other design considerations, the non-magnetic separating layer 120 can have a thickness of, for example, between 0.5 nm to 50 nm, depending on design choice.

In an exemplary embodiment, the spacer layer 140 is a tunnel barrier layer (e.g., if the memory cell 100 is a TMR memory cell). In this embodiment, the spacer layer 140 may be made of $SiO_2$, $SiN_x$, MgO, $Al_2O_3$, $AlN_x$, $TaO_x$, and/or other insulating materials. The thickness of tunnel barrier layer may range from approximately 0.5 nanometers to 3 nanometers.

In another exemplary embodiment, the spacer layer 140 is a non-magnetic conducting layer (e.g., if the memory cell 100 is a GMR memory cell). In this embodiment, the spacer layer 140 may be made of Cu, Au, Ag, and/or other non-magnetic conducting materials.

The reference layer 150 may comprise either a single layer or multiple layers of one or more ferromagnetic materials. In an exemplary embodiment, ferromagnetic materials suitable for the reference layer 150 include NiFe, NiFeCo, CoFe, other magnetic alloys of NiFe and Co, amorphous ferromagnetic alloys, and other materials. The first and second ferromagnetic layers (110 & 130) and the reference layer 150 may be made of the same or different materials. The reference layer 150 may be a pinned reference layer or a soft reference layer. In the former implementation, the magnetic orientation of the reference layer 150 is pinned to a known direction by, for example, an anti-ferromagnetic layer. In the latter implementation, the magnetic orientation of the reference layer 150 may be dynamically pinned prior to a read operation by a providing a current in a predetermined direction. In either implementation, during a read operation, the magnetic orientation of the reference layer 150 is known and may serve as a reference for determining the magnetic orientation of the data layer (e.g., the first ferromagnetic layer 110).

A data layer 160 comprising two ferromagnetic layers (110 & 130) separated by a non-magnetic separating layer 120 can be desirable because the combined magnetic volume of the two ferromagnetic layers (110 & 130) improves the thermal stability of the memory cell 100. Yet at the same time, because the two ferromagnetic layers (110 & 130) are coupled by demagnetizing fields, their combined coercivity can be reduced. For example, if the first ferromagnetic layer 110 is 4 nm thick and the second ferromagnetic layer 130 is 3 nm thick, the combined coercivity of the data layer 160 can be equal to a ferromagnetic data layer that is 1 nm thick (when the magnetic moments of the layers are antiparallel as a result of, for example, the demagnetization coupling). This is because the magnetic moments, when antiparallel, in the first ferromagnetic layer 110 and the second ferromagnetic layer 130 can cancel each other. As a result, data stored in the data layer 160 can be more easily switched by applying a write current sufficient to switch the magnetic moment of a 1 nm thick ferromagnetic layer (as opposed to a current sufficient to switch a 3 nm or 4 nm thick ferromagnetic layer). This result can be illustrated with reference to FIG. 4A. The example provided above is merely illustrative. A person skilled in the art will recognize that the magnetic volume (e.g., lateral width, thickness, shape, etc.) of each layer can be adjusted in accordance with design choice.

Figure 4A:
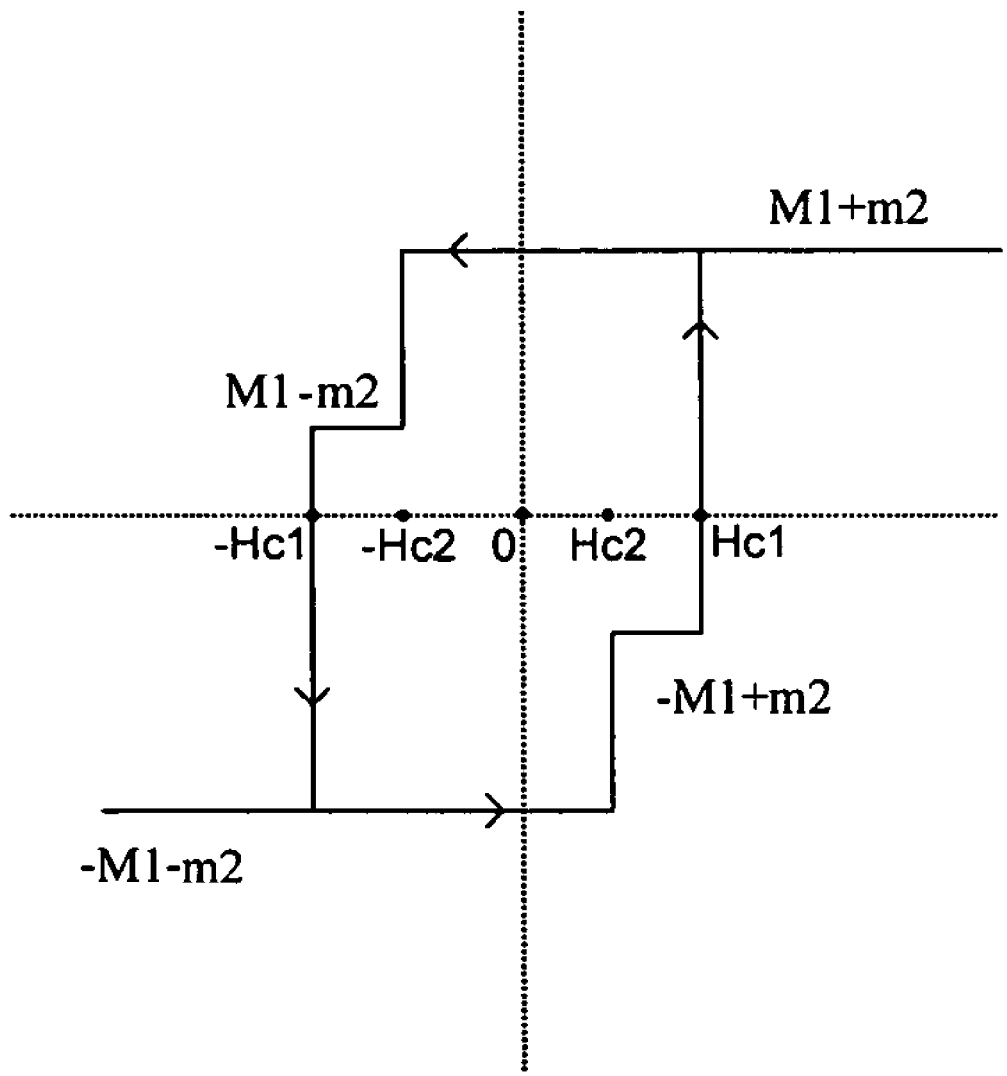
FIG. 4A illustrates an exemplary hysteresis loop of the combined total magnetic moments of first and second ferromagnetic layers separated by a non-magnetic separating layer at various applied magnetic fields.

FIG. 4A illustrates an exemplary combined hysteresis loop of the magnetic moments of the first ferromagnetic layer 110 and the second ferromagnetic layer 130. M1 represents the magnetic moment of the first ferromagnetic layer 110 which can be switched from one direction to an opposite direction by applying a magnetic field greater than Hc1 in the positive or negative direction. In FIG. 4A, m2 represents the magnetic moment of the second ferromagnetic layer 130 which can be switched from one direction to an opposite direction by applying a magnetic field greater than Hc2 in the positive or negative direction. In this example, the first ferromagnetic layer 110 has a higher coercivity (e.g., by being relatively thicker) than the second ferromagnetic layer 130. Thus, Hc1 (or coercivity of the first ferromagnetic layer 110) is greater than Hc2 (coercivity of the second ferromagnetic layer 130). The total magnetic moments of the first and second ferromagnetic layers (110 & 130) coupled by demagnetizing fields are equal to the sum of the magnetic moments of the two layers at any given applied magnetic field. For example, if the magnetic moments of both the first and second ferromagnetic layers (110 & 130) are initially parallel and positive (e.g., after an initial application of a magnetic field that exceeds Hc1 in the positive direction), then the total magnetic moment (M) is equal to M1+m2 (see the upper right hand corner of FIG. 4A). Traversing the M-H loop in a counterclockwise direction in FIG. 4A, the total magnetic moment M remains at M1+m2 until a magnetic field that exceeds Hc2 in the negative direction is applied. When the applied magnetic field is between Hc2 and Hc1 in the negative direction, the total magnetic moment M is equal to M1−m2. When the applied magnetic field exceeds Hc1 in the negative direction, the total magnetic moment M is equal to −M1−m2. If the direction of the magnetic fields is switched back to a positive direction, the total magnetic moment M will remain equal to −M1−m2 until the applied magnetic field exceeds Hc2 in the positive direction. When the applied magnetic field is between Hc2 and Hc1 in the positive direction, the total magnetic moment M is equal to −M1+m2. When the applied magnetic field exceeds Hc1 in the positive direction, the total magnetic moment M is equal to M1+m2. Thus, when the magnetic moments of the first and second ferromagnetic layers (110 & 130) are antiparallel to each other, the total magnetic moment M is equal to either M1−m2 or −M1+m2. In each instance, the total magnetic moment M is less than M1 alone. As a result, the total coercivity of the data layer 160 is reduced.

Figure 4B:
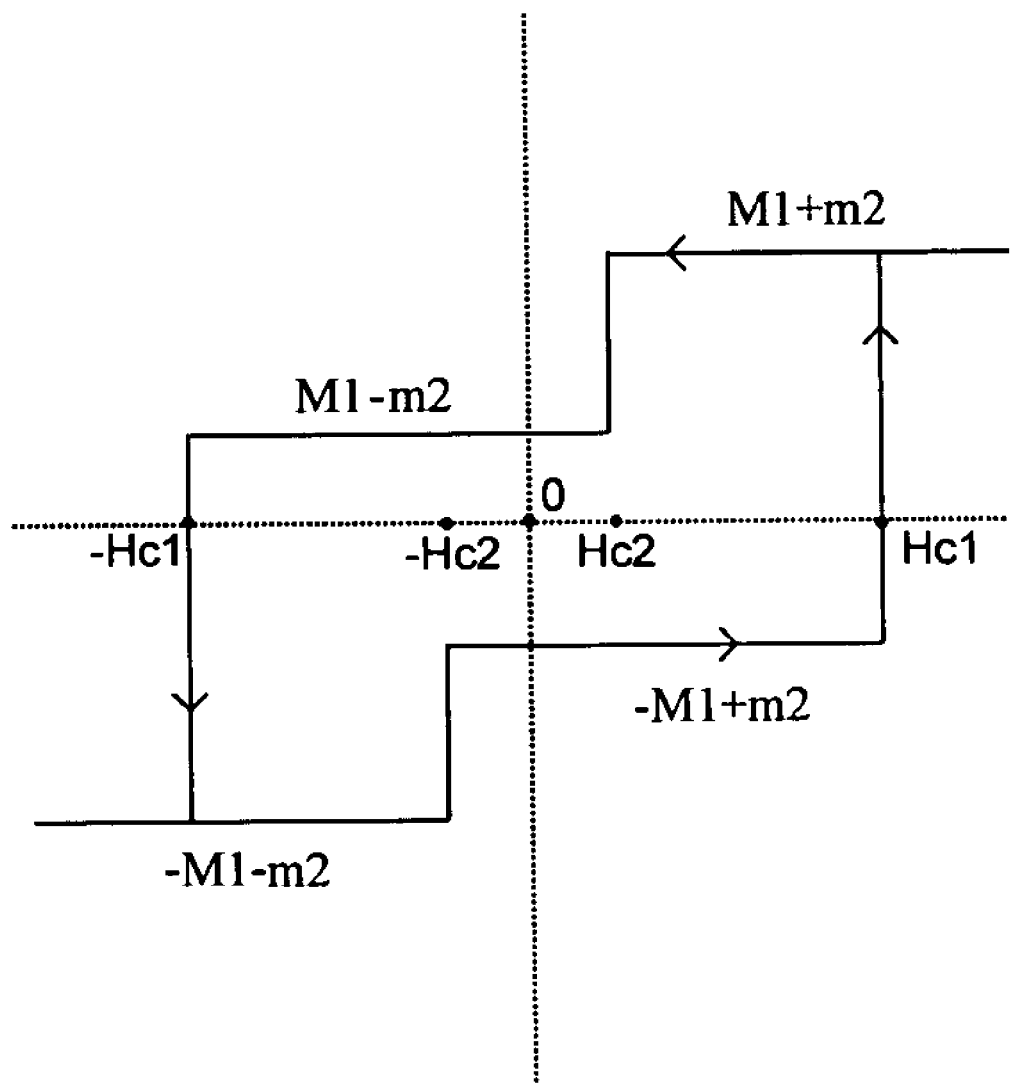
FIG. 4B illustrates another exemplary hysteresis loop of the combined total magnetic moments of first and second ferromagnetic layers separated by a non-magnetic separating layer at various applied magnetic fields.

The magnetic field Hc2 required to switch the second ferromagnetic layer 130 is a function of the magnetic coupling between the first and second ferromagnetic layers. Demagnetizing fields from layer 110 acting on layer 130 will reduce Hc2, whereas Neel coupling between layers 110 and 130 will increase Hc2. Design considerations such a ferromagnetic materials properties, memory cell geometry, film thicknesses and ferromagnetic layer roughness can be used to control the switching field Hc2 of ferromagnetic layer 130. For example, if the demagnetizing field from layer 110 is made sufficiently large, the second ferromagnetic layer 130 will switch to an anti-parallel orientation even in the absence of an external applied field. Referring to FIG. 4B, a counterclockwise excursion around the M-H loop shows that Hc2 is shifted to the opposite side of the ordinate (compared to FIG. 4A), and that layers 110 and 130 are anti-parallel for applied field equal to zero, independent of applied field history. The anti-parallel state is a preferred state for the data layer since it is a more thermally stable configuration.

Alternatively, the memory cell can be designed such that the Neel coupling exceeds the demagnetizing field, leading to preferential parallel alignment of layers 110 and 130. For this case the M-H loop shown in FIG. 4A is applicable. Proper selection of ferromagnetic materials properties, memory cell geometry, film thicknesses and ferromagnetic layer roughness can be used to ensure layers 110 and 130 are in parallel alignment in zero field, independent of field history.

Figure 5:
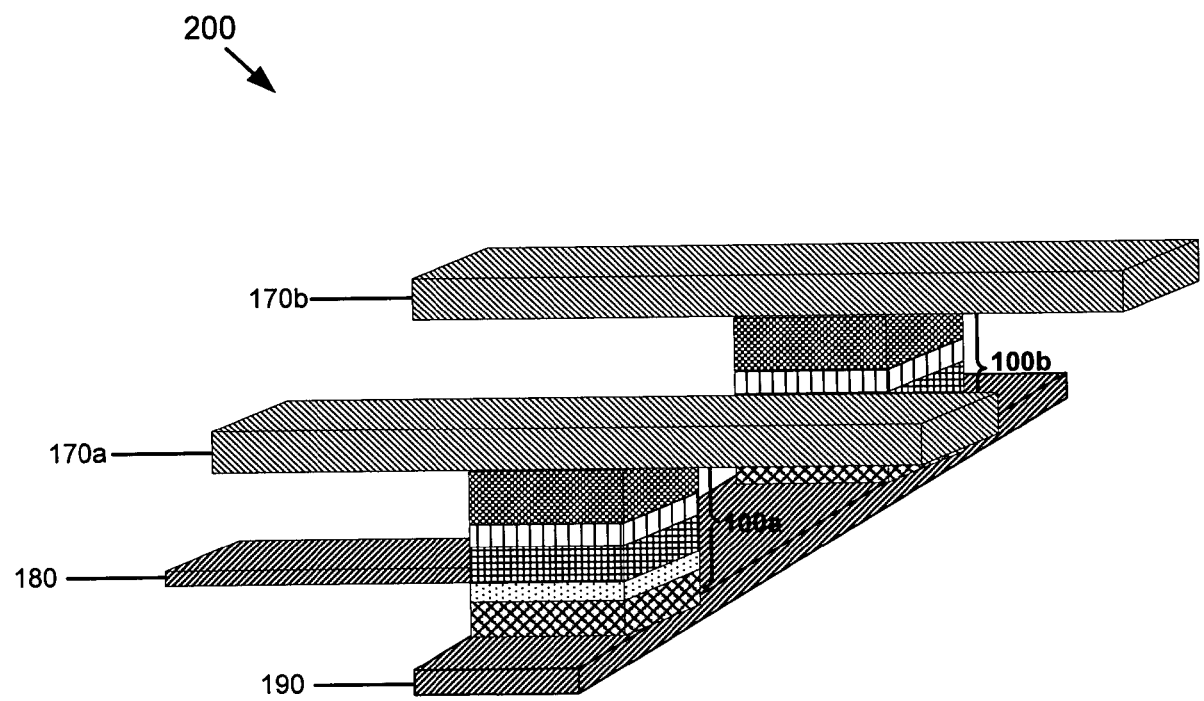
FIG. 5 illustrates an array of exemplary multi-layered magnetic memory structures of FIG. 3 and their nearby conducting lines.

FIG. 5 illustrates an exemplary memory array 200. The memory array 200 includes multiple memory cells (100a, 100b, etc.), and their nearby conducting leads (170a-170b, 180, 190) for addressing the memory cells during read and write operations. For example, memory cell 100a is located at the intersection of a word line 170a and a bit line 190 that are orthogonally arranged with respect to each other. During a write operation, memory cell 100a can be selected for writing data by applying write currents in both the word line 170a and the bit line 190 that in combination generate a magnetic field exceeding the coercivity of the data storage layer (e.g., the first ferromagnetic layer 110 in the memory 100 of FIG. 3) to switch its magnetic orientation from a positive to a negative direction or vice versa.

In addition, memory cell 100a is connected to a read line 180. During a read operation, a sense current is applied in the read line 180 and a relative resistance between the second ferromagnetic layer 130 and the reference layer 150 can be sensed by sensing the current outputting through the word line 170a to a sensing device (not shown). Thus, the sense current has a reduced influence on the magnetic moment of the data storage layer (i.e., the first ferromagnetic layer 110) because the sense current does not necessarily pass through it. For clarity read line 180 is shown as a partial conductor in FIG. 5. In an actual memory array read line 180 traverses many devices and may be oriented parallel to word line 170a or bit line 190.

Peripheral circuitry (e.g., sensing device, etc.) for reading from and writing into the memory array 200 are well known in the art and need not be described in more detail herein.

Exemplary read and write operations will now be described in more detail below.

III. Exemplary Read Operations

Figure 6A:
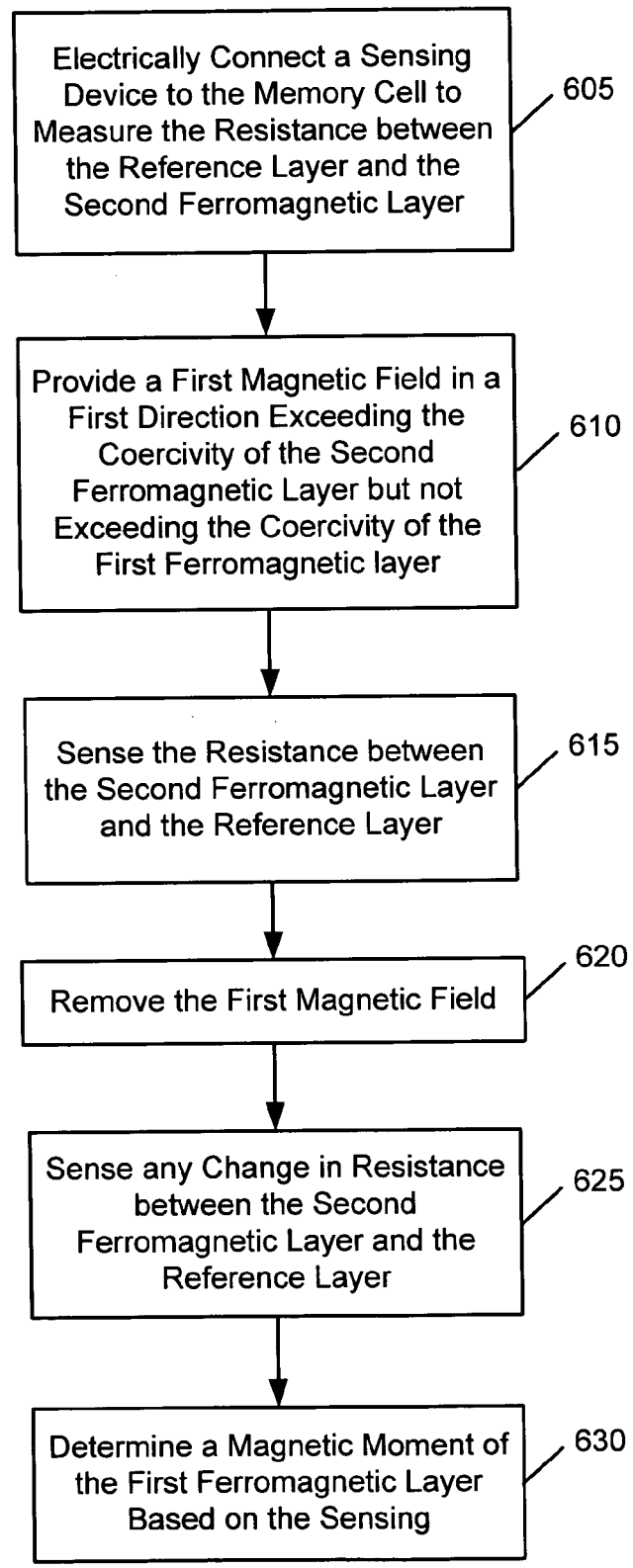
FIG. 6A illustrates an exemplary flow chart of an exemplary read operation.

FIG. 6A illustrates an exemplary read operation with reference to the exemplary memory structure illustrated in FIG. 3.

At step 605, a sensing device is electrically connected to the memory cell 100 and the resistance between the reference layer 150 and the second ferromagnetic layer 130 is measured.

At step 610, a first magnetic field is provided in a first direction (e.g., negative direction) exceeding the coercivity of the second ferromagnetic layer 130 but not exceeding the coercivity of the first ferromagnetic layer 110. In an exemplary implementation, a first read current is applied to generate the first magnetic field in the first direction.

At step 615, the sensing device previously connected to memory cell 100 is used to measure the resistance between the reference layer 150 and the second ferromagnetic layer 130 while the first read current of step 610 is applied to generate the first magnetic field.

At step 620, the first magnetic field is removed. In an exemplary implementation, the first read current for generating the first magnetic field is removed (i.e., stop applying the current).

At step 625, any change between the first and second measurement of the resistance between the second ferromagnetic layer 130 and the reference layer 150 is sensed by the sensing device.

At step 630, the magnetic moment of the first ferromagnetic layer 110 can be determined based on the sensing step 625.

Examples of the read operation described above will now be described in more detail. Further, the exemplary read operation described above can be further illustrated by referring to the exemplary representations in FIGS. 7A and 7B.

In a first exemplary read operation, the first ferromagnetic layer 110 has a magnetic moment in the negative direction, the second ferromagnetic layer 130 has a magnetic moment in the positive direction, and the reference layer 150 has a magnetic moment pinned to a positive direction. In an exemplary implementation, the magnetic moments (orientations) of the first and second ferromagnetic layers (110 & 130) are initially antiparallel to each other due at least in part to the demagnetizing coupling effect resulting from their proximity to each other (separated by the non-magnetic separating layer 120). In addition, these layers (110 & 130) are more stable in the antiparallel position because the demagnetizing fields emanating from their edges reinforce the magnetic orientation in each layer.

In this exemplary read operation, in order to read the data stored in the memory cell 100, read currents are passed through bit line 190 in the following sequence to apply a known magnetic field to first ferromagnetic layer 130. First, a sensing device is connected to the memory cell to sense the resistance between the second ferromagnetic layer 130 and the reference layer 150. Sensing of cell resistance can be contemporaneous with application of read currents. Second, referring to FIG. 4B, a read current able to produce a magnetic field in the negative direction exceeding −Hc2 but not exceeding −Hc1 is applied. Any change in resistance between the second ferromagnetic layer 130 and the reference layer 150 is sensed by a sensing device receiving the sense currents exiting through the reference layer 150. If the resistance between the second ferromagnetic layer 130 and the reference layer 150 increases during application of magnetic fields in the negative direction, then one can determine that the magnetic moment in the first ferromagnetic layer 110 is in the negative direction. If the resistance between the second ferromagnetic layer 130 and the reference layer 150 is unchanged during the application of magnetic field in the negative direction, then the magnetic moment in the first ferromagnetic layer 110 is in the positive direction. Application of a single unidirectional read current pulse is sufficient to determine the magnetic orientation of first ferromagnetic layer 110 without disturbing the magnetic state of layer 110. This sequence constitutes a non-destructive read.

Figure 7A:
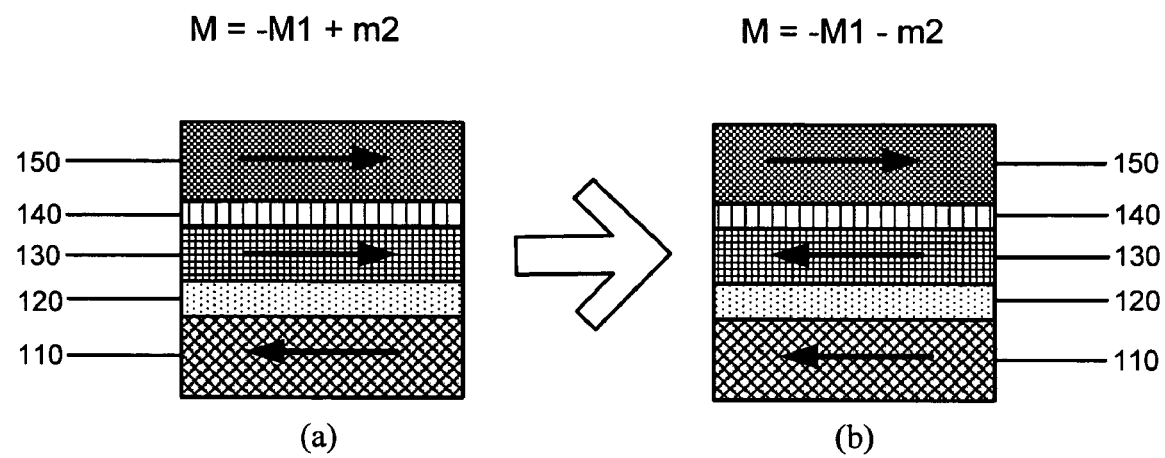
FIG. 7A illustrates an exemplary representation of an exemplary read operation.

FIG. 7A illustrates this exemplary read operation. In part (a) of FIG. 7A, the memory cell 100 is in a first state (before the read operation). In part (b) of FIG. 7A, the memory cell is in a second state. In this exemplary read operation, the magnetic moment of the second ferromagnetic layer 130 switches from being positive to being negative during application of the current that is able to produce a magnetic field in the negative direction exceeding the coercivity of the second ferromagnetic layer 130 (−Hc2) but not exceeding the coercivity of the first ferromagnetic layer 110 (−Hc1). The first state of the magnetic moment of the second ferromagnetic layer 130 is positive, thus, the resistance between the second ferromagnetic layer 130 and the reference layer 150 is relatively low. However, when the magnetic fields in the negative direction exceeds the coercivity of the second ferromagnetic layer 130, its magnetic moment switches to the negative direction and the resistance between it and the reference layer 150 becomes relatively high. Thus, the sensing device will sense an increase in resistance during application of a read current that generates a magnetic field in the negative direction. Given that the relative magnetic moments of the first and second ferromagnetic layers (110 & 130) are initially antiparallel and the magnetic moment of the reference layer 150 is pinned in the positive direction, one can therefore determine that the magnetic moment of the second ferromagnetic layer 130 is initially positive and the magnetic moment of the first ferromagnetic layer 110 is negative.

Figure 6B:
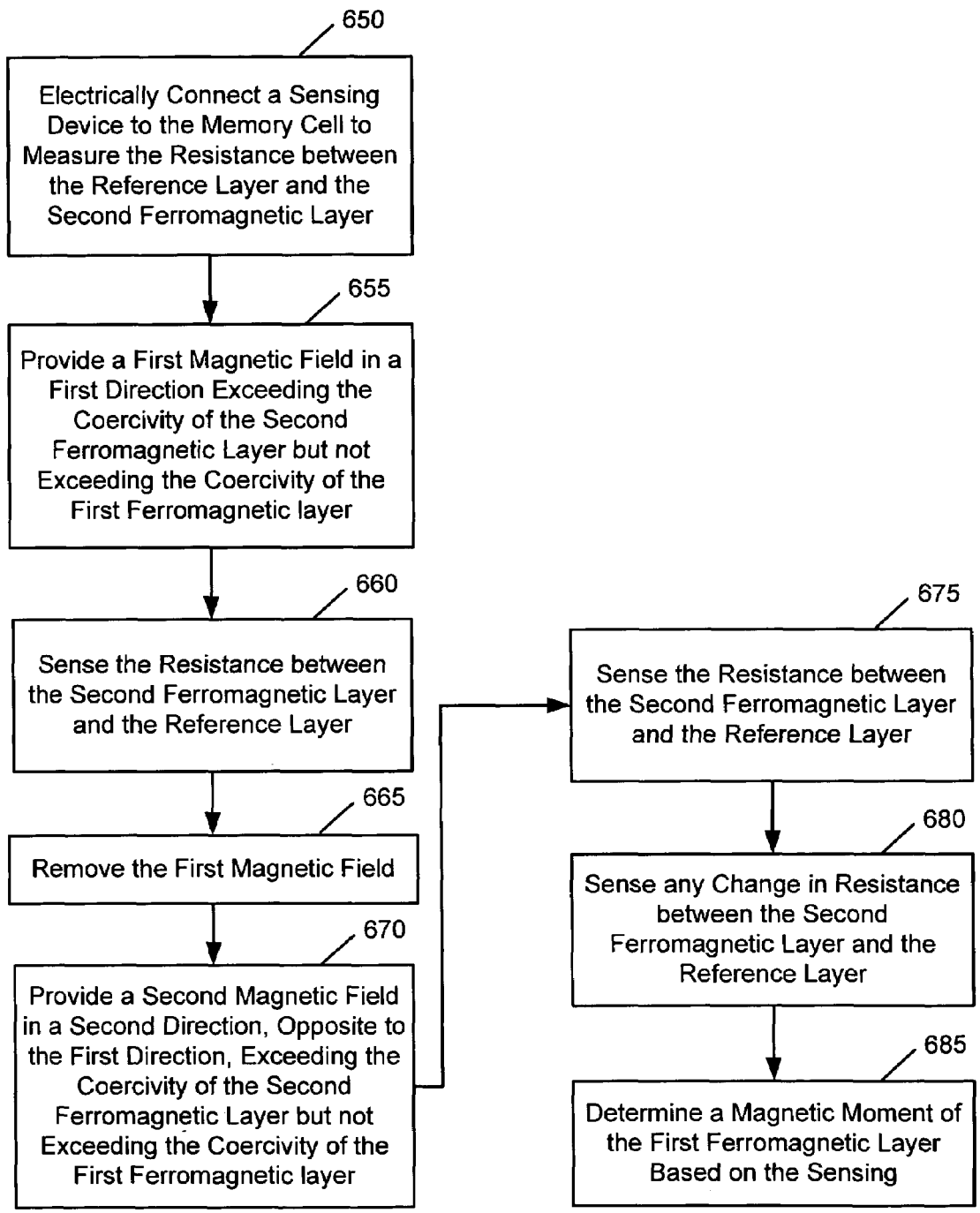
FIG. 6B illustrates an exemplary flow chart of another exemplary read operation.

The exemplary read operation described in FIG. 6A provides sufficient information to determine the magnetic orientation of the first ferromagnetic layer 110. Verification of the magnetic state can be made by providing a second read current pulse and a sense operation to the measurement sequence. FIG. 6B illustrates a second exemplary read operation.

At step 650, a sensing device is electrically connected to memory cell 100 and the resistance between the reference layer 150 and the second ferromagnetic layer 130 is measured.

At step 655, a first magnetic field is provided in a first direction (e.g., negative direction) exceeding the coercivity of the second ferromagnetic layer 130 but not exceeding the coercivity of the first ferromagnetic layer 110. In an exemplary implementation, a first read current is applied to generate the first magnetic field in the first direction.

At step 660, the sensing device previously connected to memory cell 100 is used to measure the resistance between the reference layer 150 and the second ferromagnetic layer 130 while the first magnetic field of step 655 is applied.

At step 665, the first magnetic field is removed. In an exemplary implementation, the first read current for generating the first magnetic field is removed (i.e., stop applying the current).

At step 670, a second magnetic field is provided in a second direction (e.g., positive direction), opposite to the first direction, exceeding the coercivity of the second ferromagnetic layer 130 but not exceeding the coercivity of the first ferromagnetic layer 110. In an exemplary implementation, a second read current is applied to generate the second magnetic field in the second direction.

At step 675, the sensing device previously connected to memory cell 100 is used to measure the resistance between the reference layer 150 and the second ferromagnetic layer 130 while the second magnetic field of step 670 is applied.

At step 680, any change of the resistance between the second ferromagnetic layer 130 and the reference layer 150 over the course of the read operation is sensed by a sensing device.

At step 685, the magnetic moment of the first ferromagnetic layer 110 can be determined based on the sensing step 680.

The magnetic orientation of ferromagnetic layer 110 determined from the first exemplary read operation (i.e., FIG. 6A) can be confirmed by applying the second exemplary read operation (i.e., FIG. 6B). Alternatively, one may perform either FIG. 6A or FIG. 6B.

Several steps of the second exemplary read operation will now be described in more detail with reference to FIG. 7A. In step 665, no current is applied for a period of time. During this period, the magnetic moment of the second ferromagnetic layer 130 will switch back to its initial state in the positive direction due to the demagnetizing fields from the first ferromagnetic layer 110. In step 670, a read current able to generate a magnetic field in the positive direction exceeding the coercivity of the second ferromagnetic layer 130 but not exceeding the coercivity of the first ferromagnetic layer 110 is applied. Since the magnetic moment of the second ferromagnetic layer 130 is again in the positive direction, the application of the magnetic field in the positive direction will not change its direction. Therefore, a sensing device will not detect any change (either increase or decrease) in resistance between the second ferromagnetic layer 130 and the reference layer 150 during the application of the magnetic field in the positive direction. As a result, one can confirm that the magnetic moment of the second ferromagnetic layer 130 is initially positive and the magnetic moment of the first ferromagnetic layer 110 is negative.

Figure 7B:
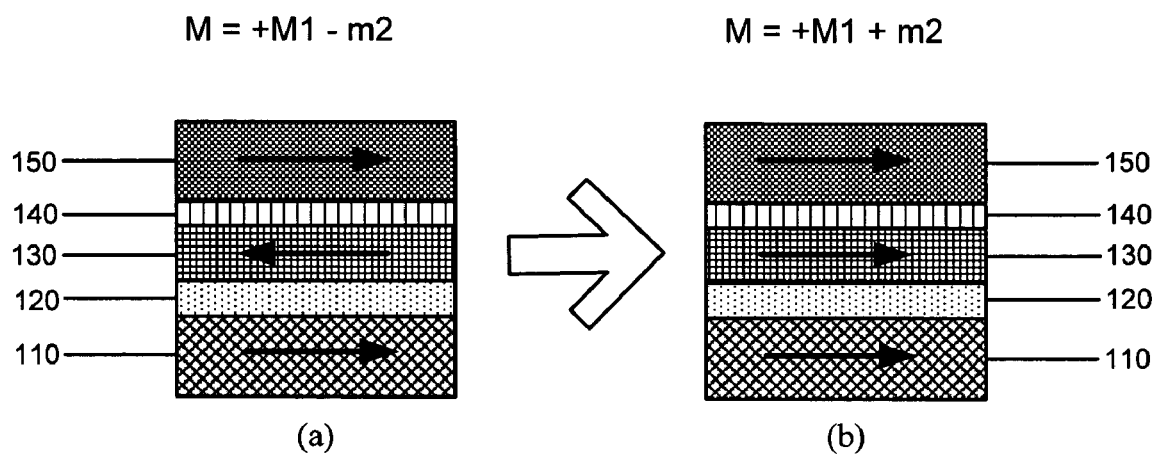
FIG. 7B illustrates an exemplary representation of another exemplary read operation.

FIG. 7B illustrates a second exemplary representation of a magnetic memory cell undergoing a read operation. The magnetic moments of the first and second ferromagnetic layers are oppositely directed compared to those of FIG. 7A. That is, the first ferromagnetic layer 110 has a magnetic moment in the positive direction and the second ferromagnetic layer 130 has a magnetic moment in the negative direction. The reference layer 150 again has a magnetic moment pinned to a positive direction. In an exemplary implementation, the magnetic orientations of the first and second ferromagnetic layers (110 & 130) are initially antiparallel to each other due at least in part to the demagnetization coupling effect resulting from their proximity to each other (separated by the non-magnetic separating layer 120).

Either the first or second exemplary read operations can be implemented to determine the magnetic state of the first ferromagnetic layer 130. Application of the second exemplary read operation to the memory cell of FIG. 7B is now described. In order to read the data stored in the memory cell 100, read currents are passed through bit line 190 to generate magnetic fields of known magnitude and direction, while a sensing device measures the resistance the resistance between reference layer 150 and ferromagnetic layer 130. First, a read current able to produce a magnetic field in the negative direction exceeding the coercivity of the second ferromagnetic layer 130 but not exceeding the coercivity of the first ferromagnetic layer 110 is applied. Second, no current is applied for a period of time. Third, a read current able to produce a magnetic field in the positive direction exceeding the coercivity of the second ferromagnetic layer 130 but not exceeding the coercivity of the first ferromagnetic layer 110 is applied. Any change in resistance between the second ferromagnetic layer 130 and the reference layer 150 is measured by a sensing device receiving the sense currents flowing through the reference layer 150, non-magnetic separating layer 120 and second ferromagnetic layer 130. If the resistance between the second ferromagnetic layer 130 and the reference layer 150 increases during application of magnetic fields in the negative direction, then one can determine that the magnetic moment in the first ferromagnetic layer 110 is in the negative direction. If the resistance between the second ferromagnetic layer 130 and the reference layer 150 decreases during application of magnetic fields in the positive direction, then one can determine that the magnetic moment in the first ferromagnetic layer 110 is in the positive direction. In this example, the latter occurred.

In part (a) of FIG. 7B, the memory cell 100 is in a first state (before the read operation). In part (b) of FIG. 7B, the memory cell is in a second state. In this exemplary read operation, the magnetic moment of the second ferromagnetic layer 130 switches from being negative to being positive during the application of the current that is able to produce a magnetic field in the positive direction exceeding the coercivity of the second ferromagnetic layer 130 but not exceeding the coercivity of the first ferromagnetic layer 110. The initial state of the magnetic moment of the second ferromagnetic layer 130 is negative, thus, the resistance between the second ferromagnetic layer 130 and the reference layer 150 is relatively high. However, when the magnetic field in the positive direction exceeds the coercivity of the second ferromagnetic layer 130, its magnetic moment switches to the positive direction and the resistance between it and the reference layer 150 becomes relatively low. Given that the relative magnetic moments of the first and second ferromagnetic layers (110 & 130) are initially antiparallel and the reference layer 150 is pinned in the positive direction, one can therefore determine that the magnetic moment of the second ferromagnetic layer 130 is initially negative and the magnetic moment of the first ferromagnetic layer 110 is positive.

This determination can be further confirmed in the first step of the exemplary read operation when a read current able to generate a magnetic field in the negative direction exceeding the coercivity of the second ferromagnetic layer 130 but not exceeding the coercivity of the first ferromagnetic layer 110 is applied. If the magnetic moment of the second ferromagnetic layer 130 is initially negative, the magnetic moment will not switch during an application of a magnetic field in the negative direction. Therefore, no change in resistance between the second ferromagnetic layer 130 and the reference layer 150 will be detected during the application of the magnetic field in the negative direction.

Figure 8:
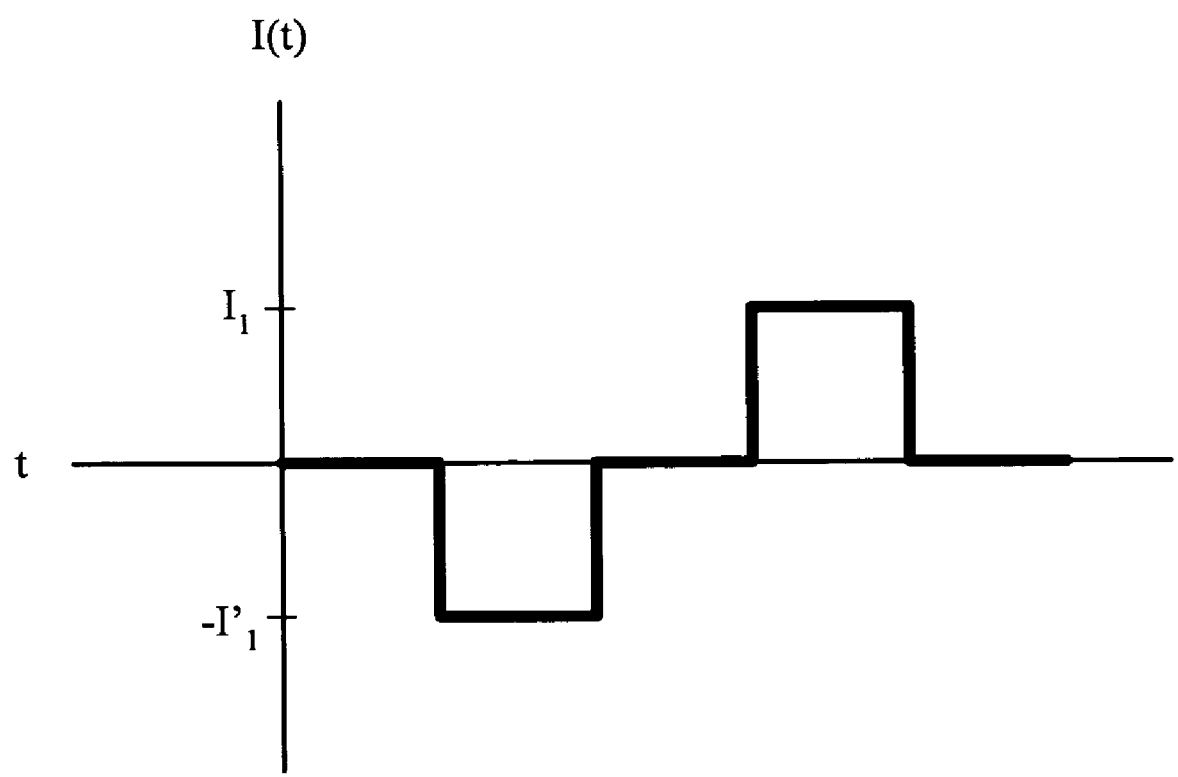
FIG. 8 illustrates an exemplary representation of read field currents during an exemplary read operation.

FIG. 8 illustrates an exemplary representation of the read currents being applied in the second exemplary read sequence described above. In this example, the current $-I'_1$ represents the read current able to produce a magnetic field in the negative direction exceeding the coercivity of the second ferromagnetic layer 130 but not exceeding the coercivity of the first ferromagnetic layer 110. The current $I_1$ represents the read current able to produce a magnetic field in the positive direction exceeding the coercivity of the second ferromagnetic layer 130 but not exceeding the coercivity of the first ferromagnetic layer 110.

The exemplary read operations described above are merely illustrative. A person skilled in the art will recognize that other sequences may be implemented in accordance with design choice. For example, a read current able to generate a magnetic field in the positive direction exceeding the coercivity of the second ferromagnetic layer 130 but not exceeding the coercivity of the first ferromagnetic layer 110 may be applied first. Further, the magnetic moment of the reference layer 150 may be pinned in a negative direction. In which case, the relative resistances described above will be reversed.

IV. Exemplary Write Operations

Figure 9:
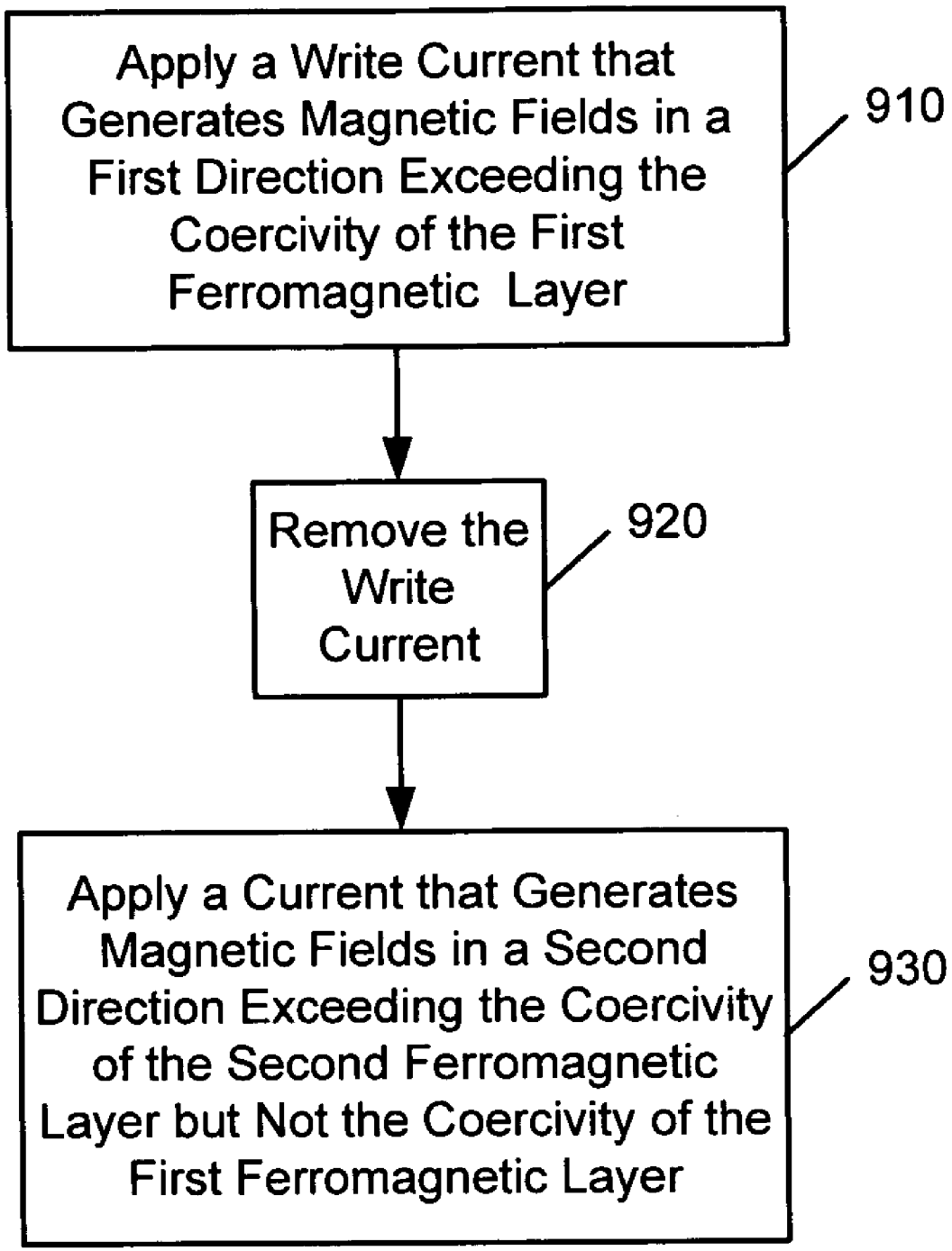
FIG. 9 illustrates an exemplary flow chart of an exemplary write operation.

In an exemplary write operation, the first ferromagnetic layer 110 has a magnetic moment in the negative direction, the second ferromagnetic layer 130 has a magnetic moment in the positive direction, and the reference layer 150 has a magnetic moment pinned to a positive direction. FIG. 9 illustrates an exemplary flow chart of the exemplary write operation.

At step 910, a write current able to generate a magnetic field in a first direction (e.g., the positive direction) exceeding the coercivity of the first ferromagnetic layer 110 is applied. This magnetic field, for example, can effectively switch the magnetic moment of the first ferromagnetic layer 110 from a negative direction to a positive direction. Because the second ferromagnetic layer 130 has a lower coercivity than the first ferromagnetic layer 110, the magnetic moment of the second ferromagnetic layer 130 is also switched to a positive direction. In practice, when taking into account the demagnetizing fields emanating from the edges of the second ferromagnetic layer 130 (whose magnetic moment is antiparallel to the first ferromagnetic layer 110), the actual write current needed to switch the magnetic moment of the first ferromagnetic layer 110 may be reduced (see FIG. 4A). However for ease of explanation, the write operation will be explained with reference to the coercivity of each ferromagnetic layer.

Next, at step 920, the write current is removed. In an exemplary implementation, the write current is no longer being applied so the magnetic field in the first direction generated by the write current is also removed. In an exemplary embodiment, the demagnetizing coupling between the first and second ferromagnetic layers (110 & 130) is sufficient to switch the magnetic moment of the second ferromagnetic layer 130 to a negative direction. As a result, the magnetic moments of the first and second ferromagnetic layers (110 & 130) are again antiparallel to each other. However, for increased device robustness, step 930 can be applied. At step 930, a current able to generate a magnetic field in a second direction (e.g., the negative direction) exceeding the coercivity of the second ferromagnetic layer 130 but not the coercivity of the first ferromagnetic layer 110 is applied to switch the magnetic moment of the second ferromagnetic layer 130 to a negative direction (without switching the magnetic moment of the first ferromagnetic layer 110). As a result, in the final state of the write operation, the magnetic moments of the first and second ferromagnetic layers (110 & 130) are again antiparallel to each other.

Figure 10:
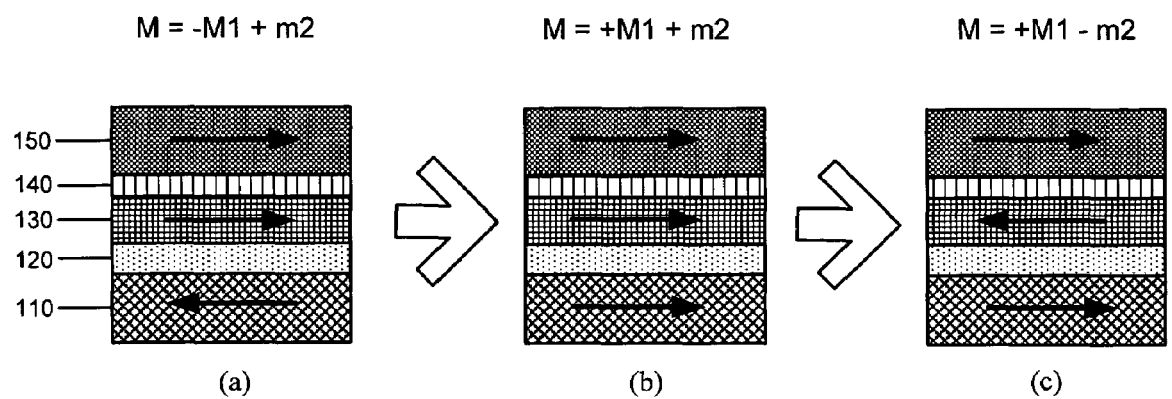
FIG. 10 illustrates an exemplary representation of the exemplary write operation of FIG. 9.

FIG. 10 illustrates an exemplary representation of the exemplary write operation described above. In part (a) of FIG. 10, the memory cell 100 is in a first state before the write operation. In part (b) of FIG. 10, the memory cell 100 is in a second state after the application of the write current as described in step 910. In part (c) of FIG. 10, the memory cell 100 is in a third state either at the end of step 920 or step 930, or both.

Figure 11:
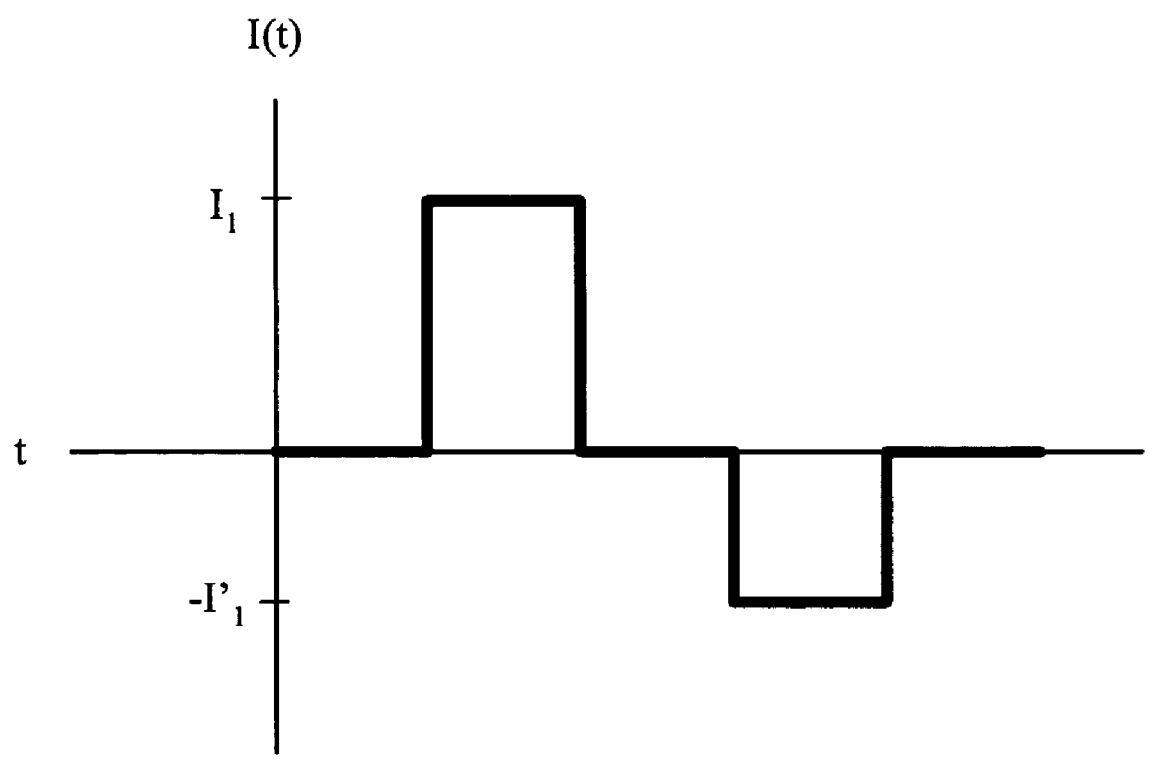
FIG. 11 illustrates an exemplary representation of write currents during an exemplary write operation.

FIG. 11 illustrates an exemplary representation of the write currents being applied in the exemplary sequence described above. In this exemplary representation, the current $I_1$ represents a current able to generate a magnetic field in a positive direction exceeding the coercivity of the first ferromagnetic layer. The current $-I'_1$ represents a current able to generate a magnetic field in a negative direction exceeding the coercivity of the second ferromagnetic layer 130 but not the coercivity of the first ferromagnetic layer 110. The exemplary write operations described above are merely illustrative. A person skilled in the art will recognize that other process (e.g., different current sequences) may be implemented in accordance with design choice. In particular, write currents described above may flow simultaneously in both the bit line and word line during the writing operation in order to select a particular array element.

Figure 12:
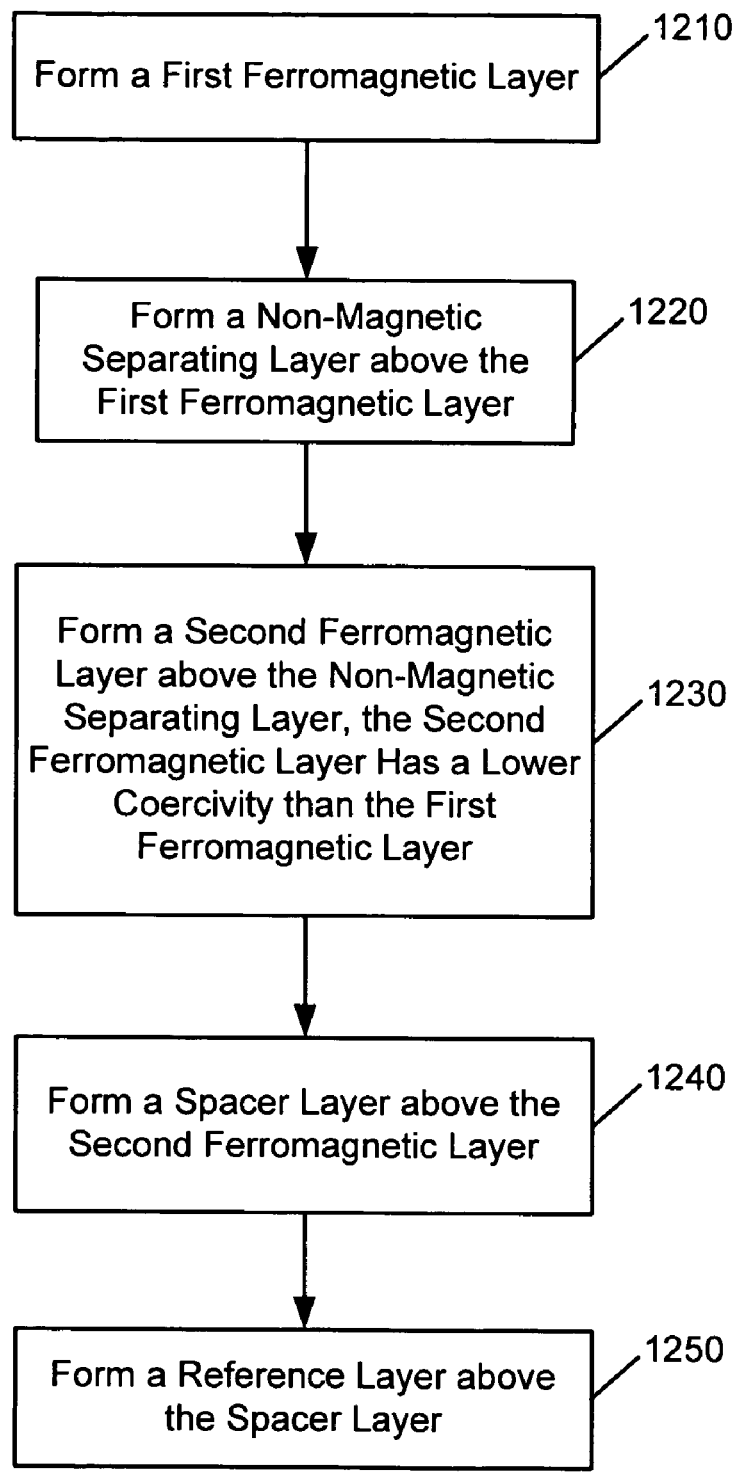
FIG. 12 illustrates an exemplary process for manufacturing the exemplary multi-layered magnetic memory structure of FIG. 3.

V. An Exemplary Process for Manufacturing a Multi-Layered Magnetic Memory Structure FIG. 12 illustrates an exemplary process for making the exemplary magnetic memory structure of FIG. 3.

At step 1210, a first ferromagnetic layer 110 is formed by deposition or other techniques known in the art (e.g., via sputtering, evaporation, chemical vapor deposition, atomic layer deposition (ALD), and/or other known techniques). In an exemplary implementation, the first ferromagnetic layer 110 can be formed above a seed layer (not shown) to enhance crystalline alignment using techniques known in the art.

At step 1220, a non-magnetic separating layer 120 is formed by deposition or other techniques known in the art.

At step 1230, a second ferromagnetic layer 130 is formed by deposition or other techniques known in the art. The second ferromagnetic layer 130 has a lower coercivity than the first ferromagnetic layer 110.

At step 1240, a spacer layer 140 is formed above the second ferromagnetic layer by deposition or other techniques known in the art.

At step 1250, a reference layer 150 is formed by deposition or other techniques known in the art.

The layers formed one above the other are, in due course, patterned and etched into multiple patterned layers for forming multiple memory cells. These patterning and etching steps are well known in the art and need not be described herein.

The manufacturing steps illustrated above are merely exemplary. Those skilled in the art will appreciate that other manufacturing steps may be used in accordance with the requirements of a particular implementation. For example, the various layers as illustrated in FIG. 3 may be formed in accordance with other manufacturing sequences (e.g., the reference layer 150 may be formed first in a bottom-pinned memory structure), one or more layers may be formed at the same time, one or more layers of different materials may be combined to form a single layer, etc.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 140 may be a non-magnetic conducting layer for constructing a GMR memory cell.

VI. CONCLUSION

The foregoing examples illustrate certain exemplary embodiments from which other embodiments, variations, and modifications will be apparent to those skilled in the art. The inventions should therefore not be limited to the particular embodiments discussed above, but rather are defined by the claims. Furthermore, some of the claims may include alphanumeric identifiers to distinguish the elements and/or recite elements in a particular sequence. Such identifiers or sequence are merely provided for convenience in reading, and should not necessarily be construed as requiring or implying a particular order of steps, or a particular sequential relationship among the claim elements.

What is claimed is:

1. A memory array including a plurality of memory cells, each of said memory cells comprising:
a first ferromagnetic layer;
a second ferromagnetic layer spaced apart from said first ferromagnetic layer by a non-magnetic separating layer and being magnetically coupled to said first ferromagnetic layer by demagnetizing fields from said first ferromagnetic layer;
a spacer layer above said second ferromagnetic layer; and
a ferromagnetic reference layer above said spacer layer;
wherein said first ferromagnetic layer, the non-magnetic separating layer, and the second ferromagnetic layer in combination function as a dual-ferromagnetic data layer of said memory cell.

2. The memory array of claim 1, wherein said first ferromagnetic layer has a higher coercivity than said second ferromagnetic layer.

3. The memory array of claim 1, wherein the magnetic moments of said first ferromagnetic layer and said second ferromagnetic layer are antiparallel.

4. The memory array of claim 1, wherein said first ferromagnetic layer and said second ferromagnetic layer comprise the same material.

5. The memory array of claim 1, wherein said non-magnetic separating layer comprises a semi-conducting material.

6. The memory array of claim 1, wherein said non-magnetic separating layer comprises a conducting material.

7. A method for writing data into a multi-layered magnetic memory structure comprising:
providing a first magnetic field to reverse a magnetic moment of a first ferromagnetic layer, the first ferromagnetic layer
being separated from a second ferromagnetic layer by a non-magnetic separating layer and
having a first coercivity higher than a second coercivity of said second ferromagnetic layer; and
providing a second magnetic field less than said first magnetic field to reverse a magnetic moment of said second ferromagnetic layer without reversing the magnetic moment of said first ferromagnetic layer.

8. The method of claim 7, wherein said first ferromagnetic layer and said second ferromagnetic layer are coupled by demagnetizing fields.

9. The method of claim 7, wherein the magnetic moments of said first ferromagnetic layer and said second ferromagnetic layer are antiparallel prior to application of said method.

10. The method of claim 7, wherein the magnetic moments of said first ferromagnetic layer and said second ferromagnetic layer are antiparallel after application of said method.

11. The method of claim 7, wherein said non-magnetic separating layer comprises a semi-conducting material.

12. The method of claim 7, wherein said non-magnetic separating layer comprises a conducting material.

13. A method for reading a multi-layered magnetic memory structure having a first ferromagnetic layer and a second ferromagnetic layer separated by a non-magnetic separating layer, said layers in combination form a dual-ferromagnetic data layer of said structure, comprising:

connecting a sensing device to said magnetic memory structure to measure a resistance between a reference layer and said second ferromagnetic layer providing a first magnetic field in a first direction exceeding the coercivity of said second ferromagnetic layer but not exceeding the coercivity of the first ferromagnetic layer:

removing said first magnetic field;

sensing, via said sensing device, any change in resistance between said second ferromagnetic layer and said reference layer; and determining a magnetic moment of said first ferromagnetic layer based on said sensing.

14. The method of claim 13, wherein the coercivity of said first ferromagnetic layer is higher than the coercivity of said second ferromagnetic layer.

15. The method of claim 13, wherein said non-magnetic separating layer comprises an insulating material.

16. The method of claim 13, wherein said non-magnetic separating layer comprises a semi-conducting material.

17. The method of claim 13, wherein said non-magnetic separating layer comprises a conducting material.

18. The method of claim 13, wherein said first ferromagnetic layer and said second ferromagnetic layer are coupled by demagnetizing fields.

19. The method of claim 13, wherein said determining further includes:

if sensing a change in resistance between said second ferromagnetic layer and said reference layer when providing a first magnetic field in said first direction, determining said magnetic moment of said first ferromagnetic layer to be in one direction; and if sensing a change in resistance between said second ferromagnetic layer and said reference layer when providing a first magnetic field in said second direction, determining said magnetic moment of said first ferromagnetic layer to be in another direction.

20. The method of claim 13, wherein the magnetic moments of said first ferromagnetic layer and said second ferromagnetic layer are antiparallel prior to application of said method.

21. The method of claim 13 further comprising:

providing a second magnetic field in a second direction, opposite to said first direction, exceeding the coercivity of said second ferromagnetic layer but not exceeding the coercivity of said first ferromagnetic layer; and sensing, via said sensing device, any change in resistance between said second ferromagnetic layer and said reference layer.

22. A memory array including a plurality of memory cells, each of said memory cells comprising:

a first ferromagnetic layer;

a second ferromagnetic layer spaced apart from said first ferromagnetic layer by an insulating separating layer;

a spacer layer above said second ferromagnetic layer; and a ferromagnetic reference layer above said spacer layer;

wherein said first ferromagnetic layer, insulating separating layer, and second ferromagnetic layer in combination function as a dual-ferromagnetic data layer of said memory cell.

23. The memory array of claim 22, wherein said first ferromagnetic layer has a higher coercivity than said second ferromagnetic layer.

24. The memory array of claim 22, wherein said first ferromagnetic layer and said second ferromagnetic layer are magnetically coupled by demagnetizing fields.

25. The memory array of claim 22, wherein the magnetic moments of said first ferromagnetic layer and said second ferromagnetic layer are antiparallel.

26. The memory array of claim 22, wherein said first ferromagnetic layer and said second ferromagnetic layer comprise the same material.

* * * * *